United States Patent [19]

Andrus

[11] Patent Number: 5,796,254
[45] Date of Patent: *Aug. 18, 1998

[54] REED SWITCH HAVING TRILUBULAR BARS FOR SURFACE MOUNTING

[75] Inventor: Everett R. Andrus, Chikasha, Okla.

[73] Assignee: Hermetic Switch, Inc., Chikasha, Okla.

[*] Notice: This patent issued on a continued prosecution application filed under 37 CFR 1.53(d), and is subject to the twenty year patent term provisions of 35 U.S.C. 154(a)(2).

[21] Appl. No.: 558,749

[22] Filed: Nov. 20, 1995

[51] Int. Cl.$^6$ .................................................. H05K 7/12
[52] U.S. Cl. ........................... 324/419; 324/423; 335/202
[58] Field of Search ................................. 324/228, 235, 324/418, 419, 423; 335/151, 153, 154

[56] References Cited

U.S. PATENT DOCUMENTS

| | | | |
|---|---|---|---|
| 3,243,696 | 3/1966 | Lovell et al. | 324/423 |
| 3,349,324 | 10/1967 | Wakefield | 324/514 |
| 3,609,524 | 9/1971 | Kazmer | 324/419 |
| 3,743,927 | 7/1973 | Bridges et al. | 324/419 |
| 3,745,447 | 7/1973 | Jaster et al. | 324/419 |
| 3,771,048 | 11/1973 | Bond et al. | 324/419 |
| 3,976,933 | 8/1976 | Banfi | 324/423 |
| 4,028,615 | 6/1977 | Jansen et al. | 324/419 |
| 4,063,203 | 12/1977 | Fujiwara et al. | 335/154 |
| 4,286,241 | 8/1981 | Olivenbaum et al. | 335/151 |
| 4,335,270 | 6/1982 | Holce et al. | 335/202 |
| 4,933,655 | 6/1990 | Matsubara | 335/151 X |
| 5,128,834 | 7/1992 | Kaschke | 361/417 |
| 5,134,375 | 7/1992 | Fuchi | 324/419 |

FOREIGN PATENT DOCUMENTS 0050969 8/1987 Japan.

*Primary Examiner*—Maura K. Regan
*Attorney, Agent, or Firm*—James T. Robinson

[57] ABSTRACT

A surface mountable reed switch, which is particularly useful for implantable devices such as pacemakers, defibrillators, drug pumps and neurostimulators. The switch includes reed contacts hermetically sealed within a tubular glass envelop, wherein the reed contacts extend through ends of the envelop to provide external contacts. A trilobular cross section mounting bar is attached to each external contact such that the reed switch can be mounted on a mounting surface such as a ceramic substrate or the like. A protective housing contains the reed switch while the attached trilobular bars extend from a side of the housing to allow communication between the switch and the mounting surface. Further, a testing apparatus is provided for evaluating how the housed reed switch will perform when installed in the implantable device and subjected to stray (must not operate) as well as designated (must operate) magnetic fields.

17 Claims, 11 Drawing Sheets

REED SWITCH HAVING TRILUBULAR BARS FOR SURFACE MOUNTING

BACKGROUND

The present invention relates generally to a reed switch having a surface mount form, and which is particularly useful in facilitating automated assembly of implantable devices such as pacemakers, defibrillators, drug pumps, neurostimulators and the like.

A conventional reed switch includes two flexible ferromagnetic reed switch contacts in a parallel partially overlapping arrangement, one contact sealed in each end of an hermetically sealed glass tube. When such a sealed reed contact arrangement is subjected to a magnetic field a flux path is established axially along one reed contact, across an air gap between the two reed contacts and axially along the second. The overlapping ends of the two reed contacts are thus oppositely polarized and attracted to one another, operating the reed switch. In practice, any given reed switch will be designed to operate and release at preselected magnetic flux densities by proper selection of reed contact materials and size of the gap between the overlapping portions of the reed contacts.

Reed switches are commonly known and used for a variety of functions, perhaps most notably in implantable devices such as pacemakers, defibrillators drug pumps and neurostimulators. In conventional manner, reed switches are pre-tested for performance and then manually installed on a ceramic substrate or similar surface of the implantable device. Nevertheless, shortcomings exist with the reed switches currently used in the implantable devices. First, the switches are unprotectably mounted within the device. Second, no pre-testing means exist for determining how the switch will perform once it is installed in the implantable device and subjected to stray (must not operate) as well as designated (must operate) magnetic fields.

Therefore, it is desirable to have a reed switch wherein the glass tube is both mechanically and thermally protected when the switch is installed in an implantable device. Further, it is desirable to have a surface mountable reed switch that can be picked and placed robotically for efficient installation on the ceramic substrate.

Additionally, it is necessary that the reed switch reliably operate and release at its designated (must operate) flux density, and thus, requires testing to evaluate the how it will perform in an implantable device that is subjected to stray (must not operate) magnetic fields. As such, it is desired to have the surface mountable reed switch mounted in a protective housing whereby operation of the housed switch can be measured before installation in order to predict its performance. For the foregoing reasons, there is a need for a simple, economical and effective surface mountable reed switch and testing apparatus therefor.

SUMMARY

The present embodiment of the invention is directed to a surface mountable reed switch that is particularly useful in implantable devices. The switch includes reed contacts hermetically sealed within a tubular glass envelop, wherein the reed contacts extend through ends of the envelop to provide external contacts. Each external contact has a trilobular cross section mounting bar attached thereto for providing the reed switch with a surface mounting means, whereby the switch can be mounted on a mounting surface such as a ceramic substrate of an implantable device.

A protective housing is provided to contain the reed switch. The attached trilobular bars extend from a side of the housing and allow communication between the switch and the mounting surface. Further, a testing apparatus is provided for evaluating how the housed reed switch will perform when installed in the implantable device and subjected to stray (must not operate) as well as designated (must operate) magnetic fields.

As such, it is a first object of the embodiment of the invention to provide a surface mountable reed switch.

It is a further object of the embodiment of the invention to provide a surface mountable reed switch contained in a housing for mechanically and thermally protecting the switch.

It is a further object of the embodiment of the invention to provide a housed reed switch that can be robotically installed on a mounting surface.

It is a further object of the embodiment of the invention to provide a housed reed switch whose operation can be measured before it is installed in an implantable device.

It is a further object of the embodiment of the invention to provide a surface mountable reed switch that is reliably tested according to the European Cenelec Standard for implantable devices before it is installed onto a mounting surface.

It is a further object of the embodiment of the invention to provide an apparatus for testing the surface mountable reed switch.

It is a final object of the embodiment of the invention to provide a method of supplying and testing a surface mountable reed switch.

BRIEF DESCRIPTION OF THE DRAWINGS

These and other features, aspects, and advantages of the present invention will become better understood with regard to the following description, appended claims, and accompanying drawings where:

DESCRIPTION

Figure 1:
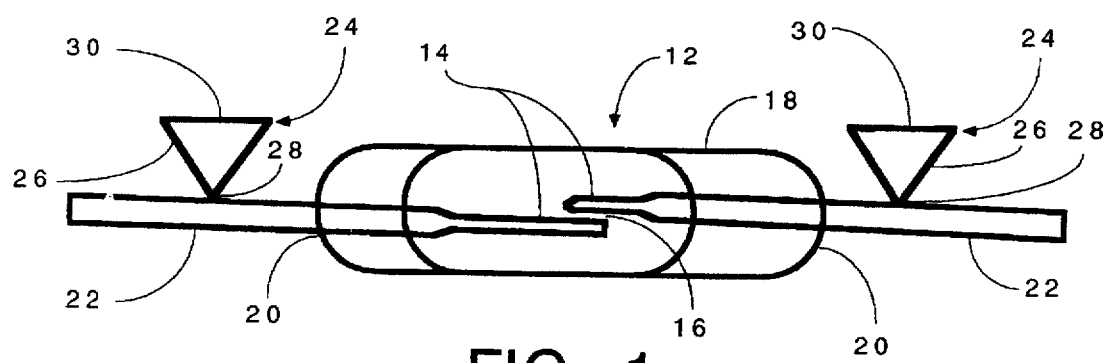
FIG. 1 is a front elevation view of a surface mountable reed switch constructed in accordance with a present embodiment of the invention.
Figure 2:
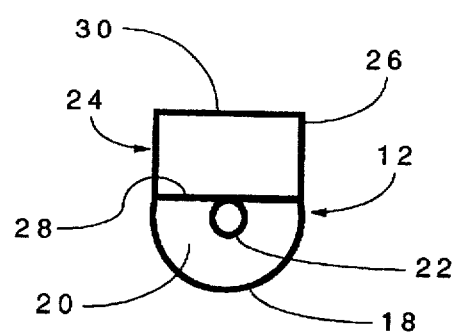
FIG. 2 is a right side elevation view of FIG. 1, the left side elevation view being a mirror image of the right side view.
Figure 3:
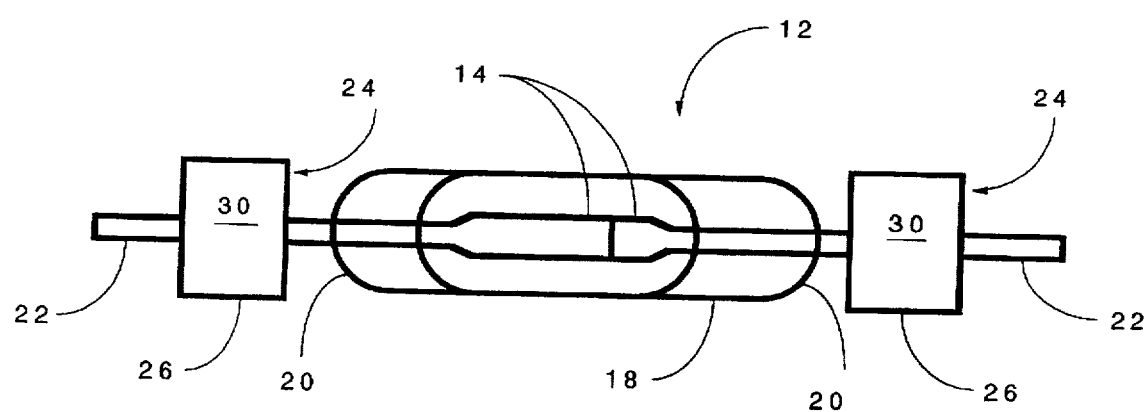
FIG. 3 is a top plan view of FIG. 1.
Figure 4:
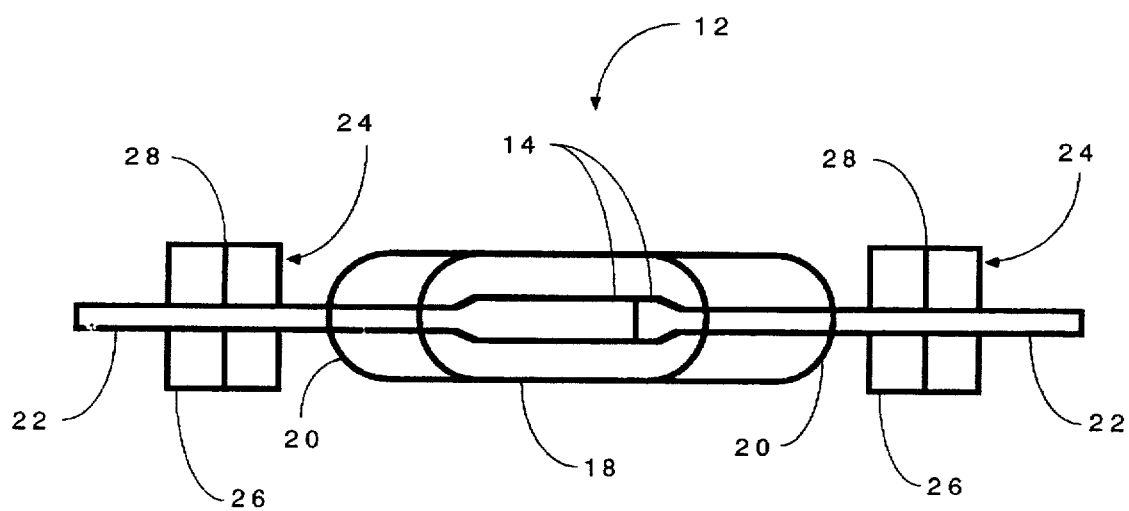
FIG. 4 is a bottom plan view of FIG. 1.

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications, and equivalents, which may be included within the spirit and scope of the invention as defined by the appended claims.

As best illustrated in FIGS. 1–4, the present embodiment of the invention relates to a surface mountable reed switch 12 which can be automatically assembled onto a ceramic substrate (not shown) or the like of an implantable device such as a pacemaker, defibrillator, drug pump or neurostimulator. In FIGS. 1–7, the preferred reed switch 12 has an internal pair of aligned reed contacts 14, preferably "DUREL" contacts commercially available from Hermetic Switch, Inc., Chickasha, Oklahoma, which form an offset gap 16 when open. Alternatively, the reed switch 12 may be constructed in conventional manner with the reed contacts 14 formed of ferromagnetic material such as nickel-iron alloy annealed to increase permeability, and copper strike contacts with rhodium plating applied to assure maximum electrical contact.

The reed contacts 14 are hermetically sealed within a tubular glass envelop 18, wherein the reed contacts 14 extend through ends 20 of the envelop 18. Thus, the reed switch 12 has external contacts 22 in communication with the internal pair of aligned reed contacts 14.

Each external contact 22 has a surface mounting means 24 attached thereto which allows the reed switch 12 to be surface mounted on a mounting surface (ie. ceramic substrate). Preferably, the surface mounting means 24 includes each external contact 22 having a trilobular cross section mounting bar, referred to herein as trilobular bars 26, attached thereto using standard resistance welding or other suitable attaching means. The trilobular bars 26 are preferably mounted such that each diverges from the external contact 22 on which it is attached. In other words, a lobe 28 or point of each trilobular bar 26 is attached to the respective external contact 22. Further, as shown in FIG. 1, the trilobular cross section of each bar 26 lies approximately perpendicular to the longitudinal axis of each respective reed contact 22.

Each external contact 22 may optionally extend beyond the bar 26 mounted thereon for enhancing the magnetic sensitivity of the reed switch 12. Each bar 26 diverges into a generally flat surface 30 which is distant from the respectively attached contact 22 and is generally parallel thereto. Preferably, the flat surfaces 30 lie in a single plane to establish acceptable coplanarity such that both bars 26 can be simultaneously placed and soldered on a generally flat surface, such as the ceramic substrate. However, the bars 26 may include any surface configuration, such as flat or round, which has sufficient area for being surface mounted onto the ceramic substrate or the like.

The external contacts 22 are preferably constructed of nickel iron, Alloy 51 which is plated with gold to minimize corrosion. The trilobular bars 26 are preferably constructed of nickel iron, Alloy 51 with gold plating and a nickel underplate. The gold and nickel platings are applied to the bars 26 per Military Standard Specifications MIL-G-45204 and QQ-N-290, respectively.

Figure 5:
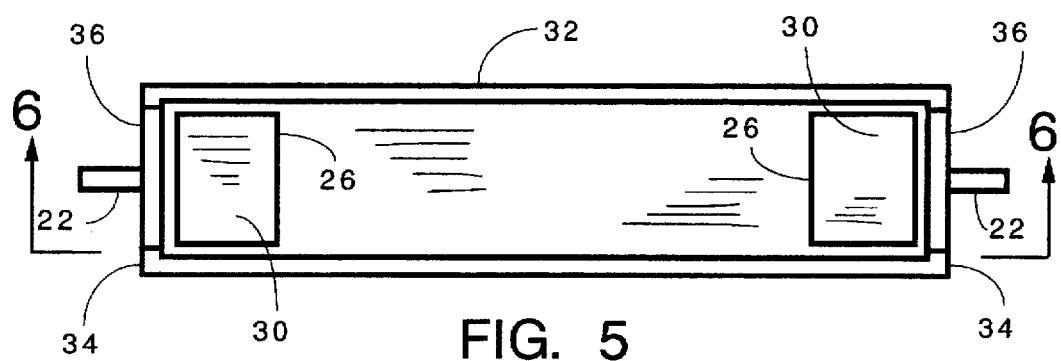
FIG. 5 is a top plan view of a surface mountable reed switch mounted in a housing.
Figure 6:
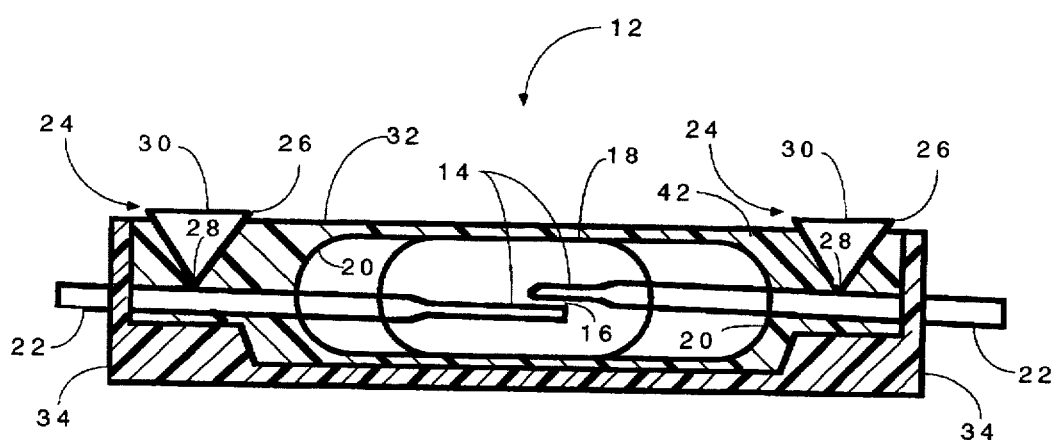
FIG. 6 is a section view taken along line 6—6 of FIG. 5.
Figure 7:
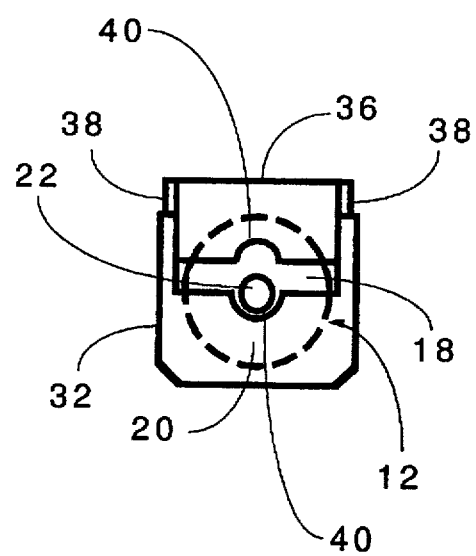
FIG. 7 is a right side elevation view of the housed reed switch of FIG. 5, wherein an end gate of the housing is partially received therein.

As shown in FIGS. 5–7, a generally rectangular housing 32 for containing the reed switch 12 is made of high temperature plastic and has a pair of opposed ends 34. Each end 34 preferably includes a gate 36 which is slidably received therein. The gates 36 contain extended members 38 which slidably engage grooves located in the ends 34 of the housing 32. Further, each end 34 and gate 36 is cooperatively designed to form an aperture 40 therebetween when mated, whereby the external contacts 22 may be received through the respective apertures 40 when the gates 36 are placed in the ends 34. Extending the external contacts 22 through the apertures 40 is optionally used to enhance the magnetic sensitivity of the reed switch 12. Any suitable configuration of high temperature plastic housing may be used wherein the surface mounting means 24 extends through the housing 32 to provide outside communication with the contained reed switch 12.

As shown in FIG. 6, the reed switch 12 is mounted in the housing 32 using a molding compound 42 such as potting epoxy. The gates 36 prevent the molding compound 42 from exiting the housing 32 before curing. The compound 42 and housing 32 provide both mechanical and thermal protection to the surface mountable reed switch 12. Additionally, as shown in FIG. 6, the bars 26 slightly extend outside the housing 32 wherein the bars 26 will sufficiently contact the surface of the ceramic substrate or the like when the housing 32 and contained switch 12 are placed thereon.

When the switch 12 is mounted within the housing 32, it may be tested as a discrete component prior to installation on the ceramic substrate. The compound 42 and housing 32 provide a stable environment such that the switch's 12 performance is not significantly altered when it is mounted on the ceramic substrate. The housed reed switch 12 can be reliably tested to predict how it will perform when actually mounted in an implantable device that is subjected to stray (must not operate) and designated (must operate) magnetic fields. Hence, performance of the preferred reed switch 12 may be tested according to the European Cenelec Standard for implantable devices.

As shown in FIGS. 8–11, a testing apparatus 44 is provided for testing the housed reed switch 12. The testing apparatus 44 comprises a base 46 having a groove 48 defined across a top side 50 thereof.

The testing apparatus 44 contains an electrical coil 52 having a permeable bar 54 positioned longitudinally through the center thereof, wherein the bar 54 forms somewhat U-shaped ends 56 opposedly extending from the coil 52. The U-shaped ends 56 are positioned with the groove 48 extending therebetween, see FIG. 8. Wires 58 are used for connecting the coil 52 with a power supply (not shown), such as a 24 VDC regulated power supply. When electrical current is provided to the coil 52, an electromagnetic field is created between the U-shaped ends 56.

Figure 11:
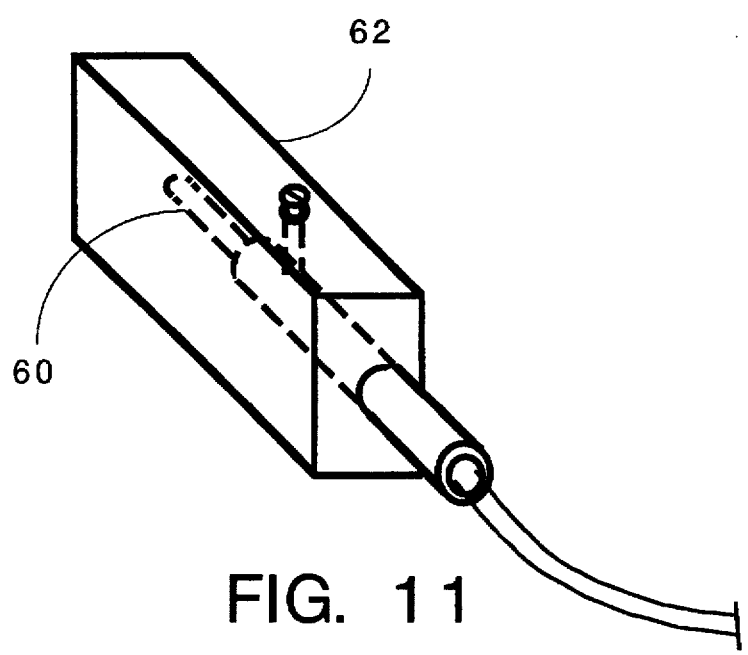
FIG. 11 is a perspective view of a gauss meter probe used in calibrating the magnetic field produced by the coil.

A conventional gauss meter (not shown) having a probe 60 contained in a probe housing 62 is provided, wherein the probe housing 62 is designed to cooperatively slide through the groove 48, see FIG. 11. As the probe housing 62 is moved through the groove 48 the probe 60 passes through the U-shaped ends 56 and the gauss meter measures the electromagnetic field being generated by the coil 52. Various electromagnetic field strengths may be obtained by altering the amount of current delivered to the coil 52. Therefore, the gauss meter and attached probe 60 measure the magnetic field strength and are removed from the testing apparatus 44 before the switch 12 is to be received therethrough for testing.

Figure 8:
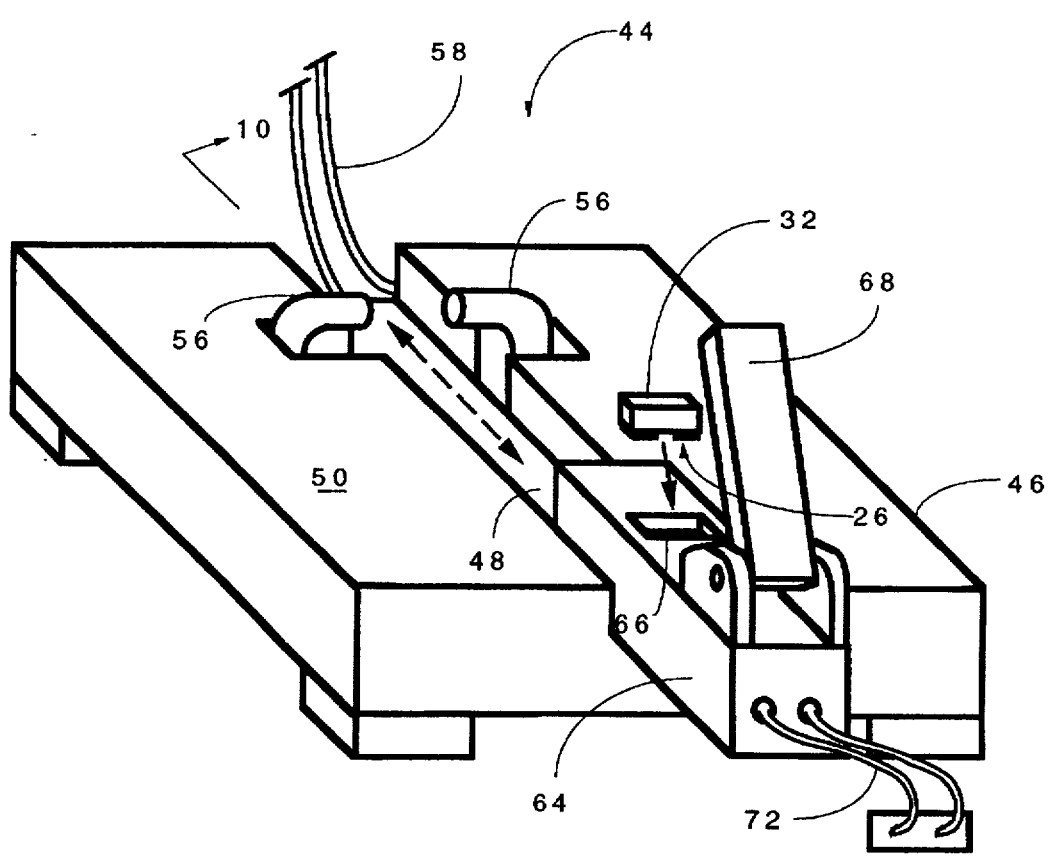
FIG. 8 is a perspective view of an apparatus for testing a surface mountable reed switch.
Figure 9:
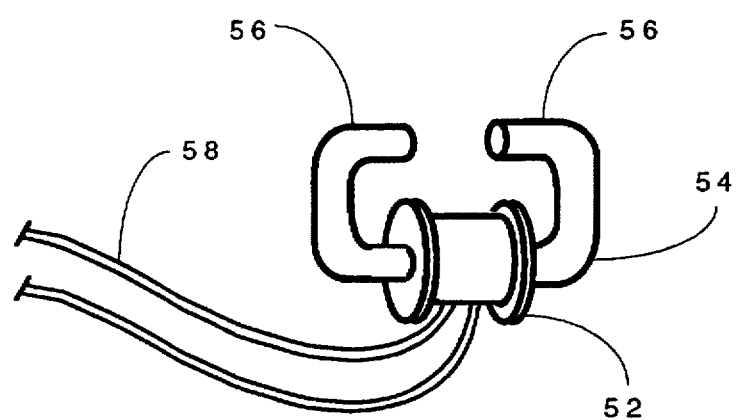
FIG. 9 illustrates the coil of the testing apparatus shown in FIG. 8.
Figure 10:
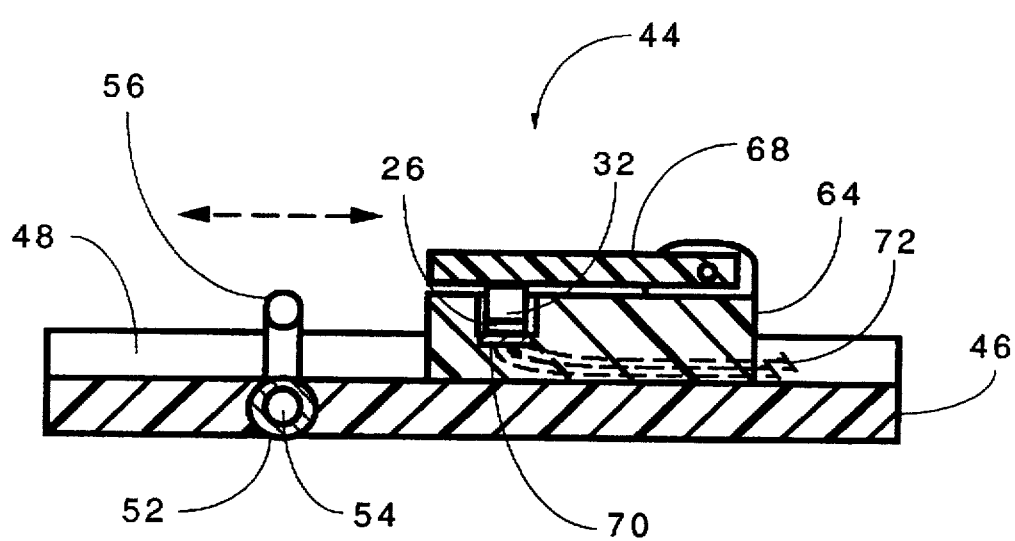
FIG. 10 is a section view taken along line 10—10 of FIG. 8, wherein the surface mountable reed switch is received in a slide mount.

Then, the housed switch 12 is placed in a slide mount 64, see FIGS. 8 and 10. The mount 64 is formed to cooperatively slide through the groove 48. The slide mount 64 includes a mount opening 66 for receiving the housed switch 12, and a top 68 pivotally attached thereto for covering and holding the housed switch 12 therein. The trilobular bars 26 extending from the housing 32 are placed in communication with surface contacts 70 located inside the slide mount 64. The surface contacts 70 are attached, via wires 72, to a conventional continuity or resistance meter (not shown) which indicates whether the internal reed contacts 14 are open or closed as the switch 12 is passed through and subjected to the known electromagnetic field, which is produced by the coil 52. Hence, the housed switch 12 is reliably tested, per the European Cenelec Standard for implantable devices, to predict how it will function when installed in an implantable device and subjected to stray (must not operate) as well as designated (must operate) magnetic fields.

A preferred method comprises the steps of: providing the surface mountable reed switch 12; mounting the switch in the housing 32 such that each means for surface mounting 24 extends therefrom; using the testing apparatus 44 to evaluate how the housed switch 12 performs when subjected to stray (must not operate) and designated (must operate) magnetic fields (ie. according to the European Cenelec Standard); and placing the housed switch 12 on a mounting surface such as a ceramic substrate or the like.

The foregoing descriptions of specific embodiments of the present invention have been presented for purposes of illustration and description. They are not intended to be exhaustive or to limit the invention to the precise forms disclosed and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A surface mountable reed switch comprising:
   a pair of reed contacts sealed in a tubular envelop wherein said reed contacts extend through said envelop to provide external contacts; and
   a surface mounting means attached to each of said external contacts, said surface mounting means diverges from each of said attached external contacts and has a generally flat surface distant therefrom.

2. The switch as recited in claim 1 wherein said surface mounting means comprises a trilobular bar and has a generally flat surface distant therefrom.

3. The switch as recited in claim 1 further comprising a housing means for containing the reed switch, said surface mounting means extends from a side of said housing means to allow outside communication with the contained switch.

4. The switch as recited in claim 3 further comprising a gate removably received in said housing means, said gate having means for receiving one of said external contacts therethrough.

5. The switch as recited in claim 1 further comprising testing means for subjecting the switch to a known magnetic field to determine how the switch performs in relation thereto.

6. The switch as recited in claim 5 wherein said testing means comprises:
   a base;
   means for providing the magnetic field;
   a slide mount having means for receiving the switch therein, said slide mount having a surface contact in communication with said surface mounting means when the switch is received therein; and
   wherein said base comprises means for slidably receiving said slide mount through the magnetic field.

7. A surface mountable reed switch comprising:
   a pair of reed contacts sealed in a tubular envelop wherein said reed contacts extend through said envelop to provide external contacts; and
   a trilobular bar attached to each of said external contacts.

8. The switch as recited in claim 7 wherein said trilobular bar diverges from said attached external contact and has a generally flat surface distant therefrom.

9. The switch as recited in claim 8 wherein each trilobular bar diverges from said attached external contact to provide a generally flat surface distant therefrom.

10. The switch as recited in claim 7 further comprising a housing means for containing the reed switch, said trilobular bar extends from a side of said housing means to allow outside communication with the contained switch.

11. The switch as recited in claim 7 further comprising testing means for subjecting the switch to a known magnetic field to determine how the switch performs in relation thereto.

12. A surface mountable reed switch comprising:
   a pair of reed contacts sealed in a tubular envelop wherein said reed contacts extend through said envelop to provide external contacts;
   a housing means for substantially enclosing the reed switch; and
   a surface mounting means attached to each of said external contacts, said surface mounting means extends through said housing means to provide an exterior surface for allowing outside communication with the reed switch.

13. The switch as recited in claim 12 wherein said surface mounting means diverges from said attached external contact.

14. The switch as recited in claim 12 wherein said surface mounting means is a trilobular bar.

15. The switch as recited in claim 12 further comprising a gate removably received in said housing means, said gate having means for receiving one of said external contacts therethrough.

16. The switch as recited in claim 12 further comprising testing means for subjecting the reed switch to a known magnetic field for determining how the switch performs in relation thereto.

17. The switch as recited in claim 16 wherein said testing means comprises:
   a base;
   means for providing the magnetic field;
   a slide mount having means for receiving the switch therein, said slide mount having a surface contact in communication with said surface mounting means when the switch is received therein; and
   wherein said base comprises means for slidably receiving said slide mount through the magnetic field.

* * * * *

UNITED STATES PATENT AND TRADEMARK OFFICE
CERTIFICATE OF CORRECTION

PATENT NO. : 5,796,254
DATED : August 18, 1998
INVENTOR(S) : Everett R. ANDRUS

It is certified that error appears in the above-identified patent and that said Letters Patent is hereby corrected as shown below:

Cover Page:
in "[54]" (title) "TRILUBULAR" should be changed to --TRILOBULAR--;
in "[75] Inventor:" "Chikasha" should be deleted and --Chickasha-- substituted therefor;
in "[73] Assignee:" "Chikasha" should be deleted and --Chickasha-- substituted therefor;

Cover Page - "[57] Abstract":
lines 5 and 6, both occurrences of the word "envelop" should be deleted and --envelope-- substituted therefor;

Column 1:
in the title, "TRILUBULAR" should be changed to --TRILOBULAR--;
lines 59 and 60, both occurrences of the word "envelop" should be deleted and --envelope-- substituted therefor;

Column 3:
lines 23 and 24, both occurrences of the word "envelop" should be deleted and --envelope-- substituted therefor;

Column 4:
line 12, "FIG. 6" should be changed to read --FIGS. 5 and 6--;
line 62, --(see FIG. 6)-- should be inserted after "housed switch 12";

Column 5:
lines 38, 39 both occurrences of the word "envelop" should be deleted and --envelope-- substituted therefor;

UNITED STATES PATENT AND TRADEMARK OFFICE
CERTIFICATE OF CORRECTION

PATENT NO. : 5,796,254
DATED : August 18, 1998
INVENTOR(S) : Everett R. Andrus

It is certified that error appears in the above-identified patent and that said Letters Patent is hereby corrected as shown below:

Column 6:
lines 8, 9, 28 and 29, all occurrences of the word "envelop" should be deleted and --envelope-- substituted therefor.

Signed and Sealed this

First Day of December, 1998

*Attest:*

BRUCE LEHMAN

*Attesting Officer*   Commissioner of Patents and Trademarks